US009354651B2

(12) United States Patent
Schmidt et al.

(10) Patent No.: US 9,354,651 B2
(45) Date of Patent: May 31, 2016

(54) SIZING AND TUNING METHODOLOGY FOR OPTIMIZED MOTION CONTROL COMPONENTS AND ENERGY EFFICIENCY

(71) Applicant: Rockwell Automation Technologies, Inc., Mayfield Heights, OH (US)

(72) Inventors: Robert H. Schmidt, Germantown, WI (US); Gerry M. Nagel, Sussex, WI (US); Robert J. Miklosovic, Strongsville, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 443 days.

(21) Appl. No.: 14/011,878

(22) Filed: Aug. 28, 2013

(65) Prior Publication Data

US 2015/0066400 A1    Mar. 5, 2015

(51) Int. Cl.
| *G01R 21/00* | (2006.01) |
| *G05F 1/66* | (2006.01) |
| *G01R 21/133* | (2006.01) |
| *G05B 11/36* | (2006.01) |
| *G05B 17/02* | (2006.01) |
| *G06F 17/50* | (2006.01) |
| *H02P 21/00* | (2016.01) |
| *G05B 13/04* | (2006.01) |
| *H02P 23/00* | (2016.01) |
| *G01R 21/06* | (2006.01) |
| *H02P 6/08* | (2016.01) |

(52) U.S. Cl.
CPC .............. *G05F 1/66* (2013.01); *G01R 21/133* (2013.01); *G05B 11/36* (2013.01); *G05B 13/042* (2013.01); *G05B 17/02* (2013.01); *G06F 17/5009* (2013.01); *H02P 21/0017* (2013.01); *H02P 21/0021* (2013.01); *H02P 23/0022* (2013.01); *H02P 6/08* (2013.01)

(58) Field of Classification Search
CPC .................................. G01N 30/24; G05F 1/66
See application file for complete search history.

(56) References Cited

FOREIGN PATENT DOCUMENTS

| WO | 0116656 A1 | 3/2001 |
| WO | WO 0116656 A1 * | 3/2001 |
| WO | 2007035559 A2 | 3/2007 |
| WO | 2010141046 A1 | 12/2010 |
| WO | WO 2010141046 * | 12/2010 |

OTHER PUBLICATIONS

European Search Report EP14182140.
Wilfried Voss, "A Comprehensible Guide to Servo Motor Sizing," Copperhill Media Corporation, 158 Log Plain Road Greenfield, MA 01301, Copyright @ 2007.
Rockwell Automation, Inc., "Motion Analyzer Software," Publication MOTION-PP002B-EN-P—Aug. 2010.
"The Smart Motion Cheat Sheet," Dec. 1999.

* cited by examiner

*Primary Examiner* — Phuong Huynh
(74) *Attorney, Agent, or Firm* — Boyle Fredrickson, S.C.

(57) ABSTRACT

Aspects of the present invention provide a tool for simulating a motion control system that simulates performance and energy for a given configuration. The simulation analysis considers a motion profile and one or more corresponding performance parameters, and the resulting configuration provides hardware elements, such as drives and motors, and settings of those elements. The simulation allows optimization for energy efficiency, as opposed to only speed or accuracy.

18 Claims, 12 Drawing Sheets

SIZING AND TUNING METHODOLOGY FOR OPTIMIZED MOTION CONTROL COMPONENTS AND ENERGY EFFICIENCY

BACKGROUND OF THE INVENTION

The present invention relates to the field of motion control systems, and, in particular, to sizing and tuning methodologies for implementing motion control systems.

Motion control in the field of automation generally refers to controlling the position, velocity or torque/acceleration of machines or loads using some type of device, such as an electromagnetic motor or actuator. Typically, a servo mechanical device (servomechanism) or drive having closed loop feedback is used, which provides error-sensing negative feedback to compensate for deviations in actual motion of the motor while attempting to follow a motion profile. In operation, a drive may power a motor according to a motion profile which, in turn, drives a load. Then, feedback is returned to the drive from the motor, which allows the drive to compensate for errors in the actual motion of the motor, periodically or continuously.

Oftentimes, a motion planner, such as one residing in a motion planner, a programmable logic controller ("PLC"), a PLC with integrated motion planner ("PLC+"), an automation controller, an industrial PC (an x86 PC-based computing platform for industrial applications) or other device, is used to provide an electronic motion profile, or command trajectory, to the drive. The motion planner sends the electronic motion profile to the drive via a common industrial protocol ("CIP") control network, which is a network suitable for highly reliable and available real-time communication. Control networks commonly used include, for example, ControlNet, DeviceNet, EtherNet/IP, SERCOS, EtherCAT, Profibus and CIP Motion, whose specifications are published and whose protocols are used broadly by a number of manufacturers and suppliers. The motion planner may also send commands via an analog interface, such as +/−10V, or digital pulse train, such as a Step and Direction Interface. Of course, the partitioning of motion control components may vary, such as by industry. In fact, some implementations may provide a PLC, drive and motor in a single package Typically, separate software tools are used for sizing and selecting motor/drive components, and for configuring, programming and executing the motion control application. Position and velocity control loops in the motion control system may be set by the industrial environment via proportional-integral-derivative ("PID") controllers and Feed-forward Gains, which may greatly impact the gain and phase response of the system and thus power/energy efficiency. Motion Analyzer, for example, a software tool from Rockwell Automation, Inc., may be used to assist in the sizing and selection of machine components, and RSLogix5000, for example, may be used to configure, program and execute the motion control application.

Sizing calculations are oftentimes performed as "backwards open loop calculations," meaning that instead of closing the loop to calculate the output and all other internal signals, the output is assumed to follow the input perfectly. Then, back calculations are made from the output to calculate other signals, such as the current and energy required.

However, this does not fully consider the effects of tuning parameters, such as gain values for the PID controller, and the motion profile, and may not account for losses in the system due to these values. For example, lower gain values increase energy efficiency but decrease performance, while higher gain values decrease energy efficiency but increase performance. Also, external disturbances in the system, such as friction, variations according to temperature, and variations in manufactured components often lead to variances that are not fully considered.

Consequently, a drive and motor may require greater current (and power or energy) than necessary to overcome such variances and external disturbances. This, in turn, leads to excess power/energy consumption, excess heat and inefficiency. A motion control software tool that estimates and improves power/energy efficiency while maintaining performance is needed. In addition, a motion control software tool that enables a user to further define their motion control application to allow maximum power efficiency to be realized with minimized cost and machine footprint is needed.

SUMMARY OF THE INVENTION

The inventors have recognized that a more accurate and efficient motion control system may be achieved by simulating performance of the motion control system for a given configuration to achieve a performance goal and minimum power (or energy) consumption. The simulation analysis considers a motion profile and one or more corresponding performance parameters, and the resulting configuration provides sizing for hardware elements, such as drives and motors, and settings or tunings for those elements. A performance parameter may characterize the electronic motion profile and/or mechanical load transmission, such as by establishing an acceptable level of corresponding performance or error. Performance parameters may include, for example, maximum position error, maximum velocity error, maximum error for regions or sections of the electronic motion profile, position settling time, position repeatability, position accuracy, position bandwidth, velocity bandwidth, acceleration time, motor thermal capacity, motor temperature and drive temperature. The simulation allows optimization to improve efficiencies including energy efficiency, reduced power consumption, cost of motor/drive components and size of motor/drive components.

Accordingly, a sizing and tuning software tool in accordance with an embodiment of the invention simulates for and displays motion planner and drives selections and configurations with tuning parameters required to meet one or more performance parameters with minimum power usage. A user may iterate to achieve a desired energy/power usage, which may impact a total cost of ownership ("TCO"), versus a bill of material ("BOM") cost of the hardware, including the drive, motor, cables, contactors, electromagnetic compatibility ("EMC") filters, and so forth.

As a result, maximum efficiency in which high performance with low power consumption may be achieved. Once implemented, this, in turn, helps to reduce power consumption, operating temperatures, and systems components in terms of size and cost, and improves the accuracy of using the correct motion component sizes.

Specifically, the present invention provides a motion control configuration program stored in a non-transitory computer-readable storage medium and executable on an electronic computer. The motion control program comprises a first data element storing an electronic motion profile characterizing a physical motion for a load over a period of time; a second data element storing a performance parameter characterizing an acceptable level of performance or error with respect to the electronic motion profile; and an evaluation engine determining a motion control configuration. The motion control configuration comprises a drive adapted to power a motor carrying out the physical motion of the load and a plurality of tuning values for the drive. The motion control configuration is determined based on implementing the electronic motion profile stored in the first data element while substantially meeting the performance parameter stored in the second data element with a minimum amount of power consumed.

The motion control program may further comprise a third data element storing another performance parameter characterizing an acceptable level of performance or error with respect to the motion profile, wherein the motion control configuration is determined based on implementing the electronic motion profile stored in the first data element while substantially meeting the performance parameters stored in the second and third data elements with a minimum amount of power consumed.

It is thus a feature of at least one embodiment of the invention to account for multiple performance parameters for optimizing the motion control configuration for power efficiency.

The performance parameters may optionally be non-overlapping with respect to time.

It is thus a feature of at least one embodiment of the invention to flexibly provide decreased power and increased efficiency during periods of time requiring less precision.

The motion control program may further comprise selecting a drive from among a plurality of drives having differing capabilities stored in a database.

It is thus a feature of at least one embodiment of the invention to enable selection of an optimal hardware element for achieving the desired goal.

The drive may include a proportional-integral-derivative controller for controlling position, velocity, and acceleration, and the plurality of tuning parameters may be a plurality of gain values for the proportional-integral-derivative controller.

It is thus a feature of at least one embodiment of the invention to utilize a drive having closed loop feedback.

The motion control program may further comprise displaying to a graphical user interface results comparing power consumed to performance of the motion control configuration.

It is thus a feature of at least one embodiment of the invention to provide information helpful to a user for selecting an optimal configuration.

The displaying may allow selecting differing motion control configurations showing differing results.

It is thus a feature of at least one embodiment of the invention to allow a user to analyze the effect of various configurations on the fly.

The motion control program may further comprise changing at least one of the electronic motion profile, the performance parameter and the plurality of tuning parameters to determine a motion control configuration optimized with respect to power consumed versus performance of the motion control configuration.

It is thus a feature of at least one embodiment of the invention to allow a user to iteratively change the configuration to achieve a particular goal.

Determining the motion control configuration may comprise simulating a trajectory of the electronic motion profile using a model stored in database and accumulating power consumption along the trajectory.

It is thus a feature of at least one embodiment of the invention to utilize an algorithm to determine the motion control configuration.

The performance parameter may indicate a maximum position error or maximum velocity error.

It is thus a feature of at least one embodiment of the invention to consider various types of performance parameters in determining a motion control configuration.

These particular features and advantages may apply to only some embodiments falling within the claims and thus do not define the scope of the invention.

Figure 1:
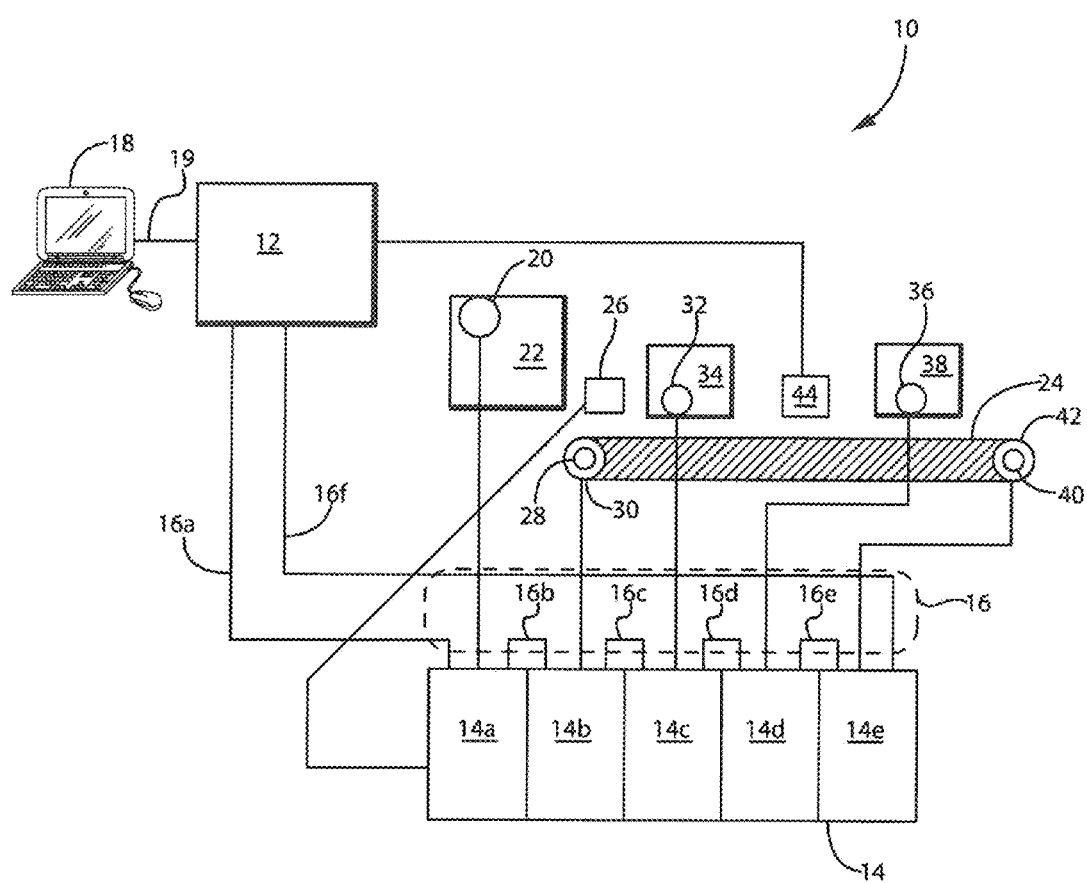
FIG. 1 is a diagram of an exemplar industrial control system.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose.

DETAILED DESCRIPTION OF THE PREFERRED EMBODIMENT

Referring now to FIG. 1, a diagram of an exemplar industrial control system 10 comprises a motion planner 12, which may reside within, for example, a programmable logic controller ("PLC"), serially coupled to a modular servo mechanical drive 14 via an industrial control network 16 forming a network ring. The exemplar industrial control system 10 is shown using a network ring topology by way of example only and it will be appreciated that other such configurations and topologies, including but not limited to linear, daisy-chain and/or star topologies, may be readily used instead or in addition as known in the art. The industrial control network 16 may be a common industrial protocol ("CIP") or other control network, and may be implemented via ControlNet, DeviceNet, EtherNet/IP, SERCOS EtherCAT, Profibus or CIP Motion as understood in the art.

The motion planner 12 includes a processor, memory and data storage, and may be, for example, a Rockwell 1756 ControlLogix® system as available from Rockwell Automation, Inc. The drive 14 is adapted to power a motor, which carries out a physical motion for a machine or load over a period of time, and may be, for example, a Rockwell Kinetix 6000 multi-axis servo drive.

In an exemplar network ring topology, the motion planner 12 couples to a first modular drive 14a of the drive 14 via a first control network segment 16a. The first modular drive 14a then couples to a second modular drive 14b of the drive 14 via a second control network segment 16b. The second modular drive 14b then couples to a third modular drive 14c of the drive 14 via a third control network segment 16c. The third modular drive 14c then couples to a fourth modular drive 14d of the drive 14 via a fourth control network segment 16d. The fourth modular drive 14d then couples to a fifth modular drive 14e of the drive 14 via a fifth control network segment 16e. The fifth modular drive 14e then couples to the motion planner 12 via a sixth control network segment 16f. Other embodiments may be implemented according to other topologies.

The motion planner 12 also couples and communicates with an electronic computer 18 having a processor, memory and data storage over a computer network interface 19. The motion planner 12 and the computer 18 may each have input and output devices, such as a keyboard, mouse and monitor, and may each execute programs stored in non-transitory computer-readable storage medium, including ROM, RAM, flash, other solid state, disc, magnetic, optical or other drive, and provide a graphical user interface, which may include a touch screen monitor.

The first modular drive 14a couples to a first electric motor 20 attached to a first machine or load 22. The first electric motor 20 provides rotary motion for causing the first machine or load 22 to complete a first industrial task, such as placing a box on a conveyor belt 24 upon triggering of a sensor 26 coupled to the first modular drive 14a. The second modular drive 14b couples to a second electric motor 28 attached to a second machine or load 30. The second electric motor 28 provides rotary motion for causing the second machine or load 30 to complete a second industrial task, such as rolling the conveyor belt 24. The third modular drive 14c couples to a third electric motor 32 attached to a third machine or load 34. The third electric motor 32 provides rotary motion for causing the third machine or load 34 to complete a third industrial task, such as filling the box that was placed on the conveyor belt 24. The fourth modular drive 14d couples to a fourth electric motor 36 attached to a fourth machine or load 38. The fourth electric motor 36 provides rotary motion for causing the fourth machine or load 38 to complete a fourth industrial task, such as closing the filled box. A fifth modular drive 14e couples to a fifth electric motor 40 attached to a fifth machine or load 42. The fifth electric motor 40 provides rotary motion for causing the fifth machine or load 42 to complete a fifth industrial task, such as rolling the same conveyor belt 24 or another conveyor belt. Finally, the motion planner 12 may couple to a sixth electric motor 44 for causing the sixth machine or load to complete a sixth industrial task, such as dispensing glue before the fourth machine or load 38 closes the filled box. Other motions, such as linear motions or hybrid motions, and/or other tasks may also be accomplished in the industrial control system 10.

In operation, the motion planner 12, or the computer 18, executes a motion control program. Next, the motion planner 12 provides an electronic motion profile (e.g., position or velocity), or command trajectory, for each of the electric motors 20, 28, 32, 36 and 40 in the industrial control system 10. For example, the motion planner 12 provides a desired first motion profile for the first electric motor 20 to the first modular servo drive 14a; a desired second motion profile for the second electric motor 28 to the second modular servo drive 14b; and so forth, each through the control network 16.

Next, each of the electric motors 20, 28, 32, 36 and 40 in the industrial control system 10 is controlled by its respective modular drive 14a, 14b, 14c, 14d and 14e to carry out a respective desired motion profile. For example, the first modular servo drive 14a controls the first electric motor 20 to drive the first machine or load 22 according to the desired first motion profile; the second modular servo drive 14b controls the second electric motor 28 to drive the second machine or load 30 according to the desired second motion profile; and so forth.

Next, feedback is returned to each of the modular servo drive 14a, 14b, 14c, 14d and 14e from the respective electric motors 20, 28, 32, 36 and 40. This allows the modular servo drive 14a, 14b, 14c, 14d and 14e to compensate for errors in the actual motion of the respective electric motors 20, 28, 32, 36 and 40 periodically or continuously. Such motion control systems and environments are described in co-pending U.S. patent application Ser. No. 14/011,843 to the present inventors, the contents of which is hereby incorporated by reference in its entirety.

Figure 2:
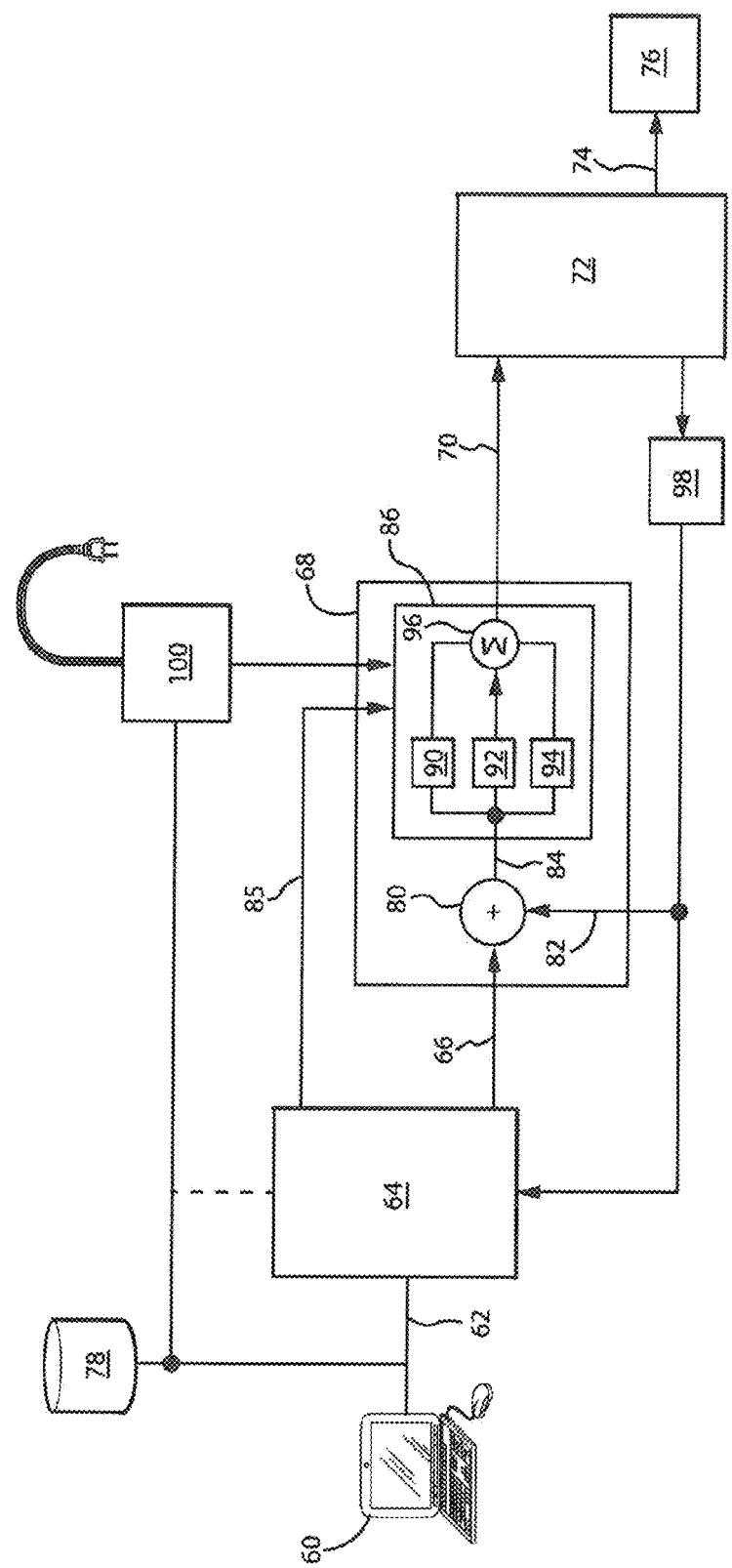
FIG. 2 is a diagram of a closed loop feedback system in accordance with an embodiment of the invention.

Referring now to FIG. 2, an exemplar closed loop motion control feedback system includes an electronic computer 60 having a processor, memory and data storage coupled via a network interface 62 to a motion planner 64. The motion planner 64, which may be for example a PLC, in turn, couples via an industrial control network 66 (or ±10V analog interface or digital pulse train) to a drive 68. The drive 68, in turn, couples via a power connection 70 to an electromagnetic actuator or motor 72. The motor 72, in turn, couples via a coupling 74 to a machine or load 76 for effecting physical motion in the load 76. As a result, the load 76 undergoes changes in position, velocity and/or acceleration. In addition, the load 76, having a mass put in motion, experiences various forces, losses and other external disturbances, including inertia and friction.

In operation, for each axis, the electronic computer 60 receives and stores an electronic motion profile characterizing a physical motion for the load 76 over a period of time and performance parameters characterizing an acceptable level of performance or error with respect to the electronic motion profile. Performance parameters may include, for example, any of the following: (1) maximum position error, (2) maximum velocity error, (3) maximum error for regions or sections of the electronic motion profile; (3) position settling time; (4) position repeatability, (5) position accuracy; (6) position bandwidth; (7) velocity bandwidth; (8) acceleration time; (9) motor thermal capacity; (10) motor temperature; and (11) drive temperature. The motion profile and performance parameters may be provided via user input at the electronic computer 60 or from the network interface 62, including from the Internet. The electronic computer 60 communicates via the network interface 62 with a database 78 which contains simulation modeling data for hardware products in the motion control system, such as drives, motors, cables, contactors, electromagnetic compatibility ("EMC") filters, and so forth, and related algorithms.

A simulation may be performed from the electronic computer 60 using the electronic motion profile, performance parameters and simulation modeling data. The same or an optimized electronic motion profile, tuning parameters and other data is sent to the motion planner 64. In turn, the motion planner 64 sends the electronic motion profile to the drive 68 via the industrial control network 66.

The drive 68 receives the electronic motion profile at a junction point 80, which may be a summer. In a closed loop feedback configuration, the drive 68 compares the electronic motion profile from the industrial control network 66 to a feedback signal 82 at the junction point 80, which allows the drive 68 to compensate for errors in the actual motion of the motor 72 or the load 76 periodically or continuously. A resulting error 84 is transferred to a feedback implementing controller 86, which may be a proportional-integral-derivative ("PID") controller, or any type of feedback controller (e.g., State Feedback, H-Infinity, PDFF, Fuzzy Logic, Kalman Filter, etc.). For example, the feedback implementing controller 86 may receive the resulting error 84 at each of a proportional drive 90, an integral drive 92 and a derivative drive 94 within the feedback implementing controller 86. The motion planner 64 also provides the tuning parameters to the feedback implementing controller 86 via a tuning connection 85, which may be, for example, various feed forward position, velocity and/or acceleration gain values for the PID controller as understood in the art, including $K_{pp}$, $K_{pi}$, $K_{vp}$, $K_{vi}$, $K_{vff}$ and $K_{aff}$.

The output from the proportional drive 90, the integral drive 92 and the derivative drive 94 may be fed to a summation point 96, which, in turn, generates an appropriate amount of power/energy (current and voltage) via the power connection 70 for powering the motor 72. The motor 72, in turn, provides via a position or velocity sensor 98 the feedback signal 82 to the drive 68 and the motion planner 64 for providing adjustments.

A power meter 100 may also monitor the amount of power/energy delivery to the drive 68 for powering the motor 72. The power meter 100 may provide feedback relating to power (or energy) consumption by the drive 68 to the motion planner 64. As a result, the motion planner 64, an energy controller (not shown) and/or the electronic computer 60 via the network interface 62 may verify energy demands and/or adjust the motion control system for power optimization. For example, the electronic motion profile and/or one or more of the performance parameters may be changed.

If, for example, an energy controller needs to regulate to a specific energy cost demand in a plant, the energy controller could set the motion profile to a slower rate to meet the energy cost demand. In other words, a user could set a machine from 1000 garments per minute to instead perform at 500 garments per minute to meet a high energy cost demand occurrence, such as higher energy costs in the evening.

Figure 3:
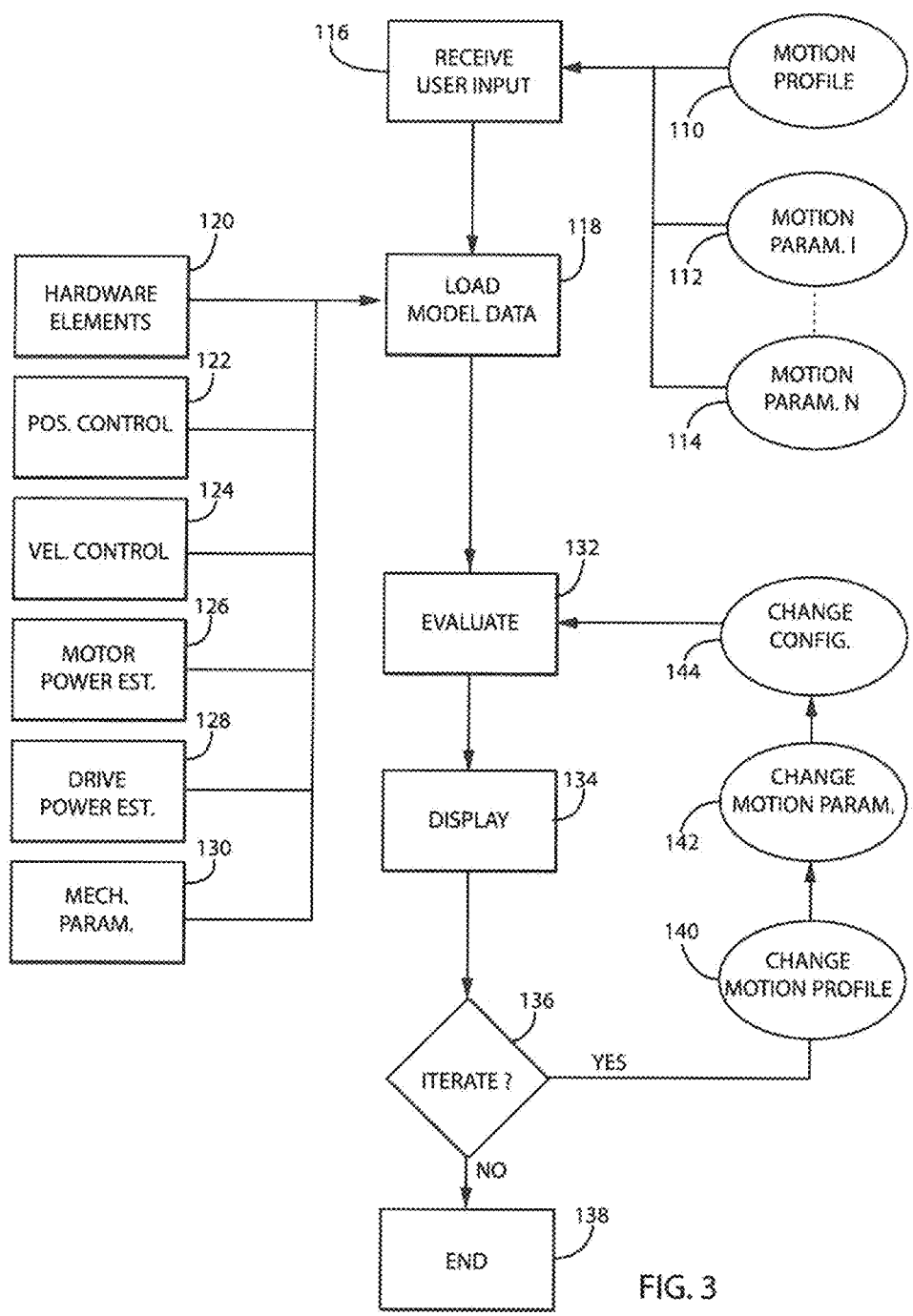
FIG. 3 is flow chart for a motion control configuration in accordance with an embodiment of the invention.

Referring now to FIG. 3, a flow chart illustrates a motion control configuration process which may be implemented in a computer program in accordance with an embodiment of the invention. At input block 110, an electronic motion profile characterizing a physical motion for a load over a period of time is held in a first data element. At input blocks 112 and 114, performance parameters 1 through N characterizing the electronic motion profile, such as an acceptable level of performance or error, are held in additional data elements. As described above with respect to FIG. 2, performance parameters may include, for example, any of the following: (1) maximum position error; (2) maximum velocity error, (3) maximum error for regions or sections of the electronic motion profile; (3) position settling time; (4) position repeatability; (5) position accuracy; (6) position bandwidth; (7) velocity bandwidth; (8) acceleration time; (9) motor thermal capacity; (10) motor temperature; and (11) drive temperature. The performance parameters may optionally be non-overlapping with respect to time. At block 116, each of the data elements from input blocks 110, 112 and 114 are received, which may be referred to as "user input," although they may be machine or software generated in other embodiments.

Next, at block 118, simulation and modeling data for the motion control system is loaded. The simulation and modeling data may include one or more of the following elements, each of which may be stored in a database: energy and performance models for motion planners, drives and other hardware at block 120; a position controller simulation model at block 122; a velocity controller simulation model at block 124; a position motor power/energy estimator at block 126; a drive power/energy estimator at block 128; and models of mechanical parameters, such as gearboxes, ball screws, couplings, and so forth, at block 130.

Next, at block 132, an evaluation engine determines a motion control configuration comprising a drive adapted to power a motor carrying out the physical motion of the load and tuning parameters for the drive. The motion control configuration is determined based on implementing the electronic motion profile stored at input block 110 while substantially meeting the performance parameters at input blocks 112 and 114 with a minimum amount of power consumed. A drive, which may include PID controllers, may be selected from among a plurality of drives having differing capabilities stored in a database, and gain values for the drive.

Next, at block 134, results are displayed to a graphical user interface. The results may compare, for example, power consumed by the drive, the motor, the load and/or other components, or the motion control system as a whole, to performance of the motion control configuration. Performance may be measured, for example, by way of throughput, such as a configuration producing 1000 garments per minute. In displaying the results, a user may be allowed to select differing motion control configurations, which may include differing bills of materials ("BOM") and costs in the form of motors, drives and other hardware, and differing tuning parameters, showing differing results.

In decision block 136, a user program may be allowed to determine whether further optimization may be appropriate or not. If changes are not desired, in block 138, the flow chart concludes with an optimized motion control configuration. If changes are desired, the user or program may proceed to one or more of blocks 140, 142 and 144, which may include changing one or more of the electronic motion profile, the performance parameter and the motion control configuration, including the tuning parameters, respectively. Then, the process returns to the evaluation engine in block 132, displaying to the graphical user interface in block 134 and once again the decision block 136. This process may repeat iteratively for selecting an optimal configuration.

Accordingly, power/energy usage for a number of motion profile settings which are deemed acceptable by a user for reduced energy mode of operation for a machine or load may be determined. As a result, maximum efficiency in which high performance with low power consumption may be achieved. Once implemented, this, in turn, helps to reduce power consumption, operating temperatures, and systems components in terms of size and cost, and improves the accuracy of using the correct motion component sizes.

Figure 4:
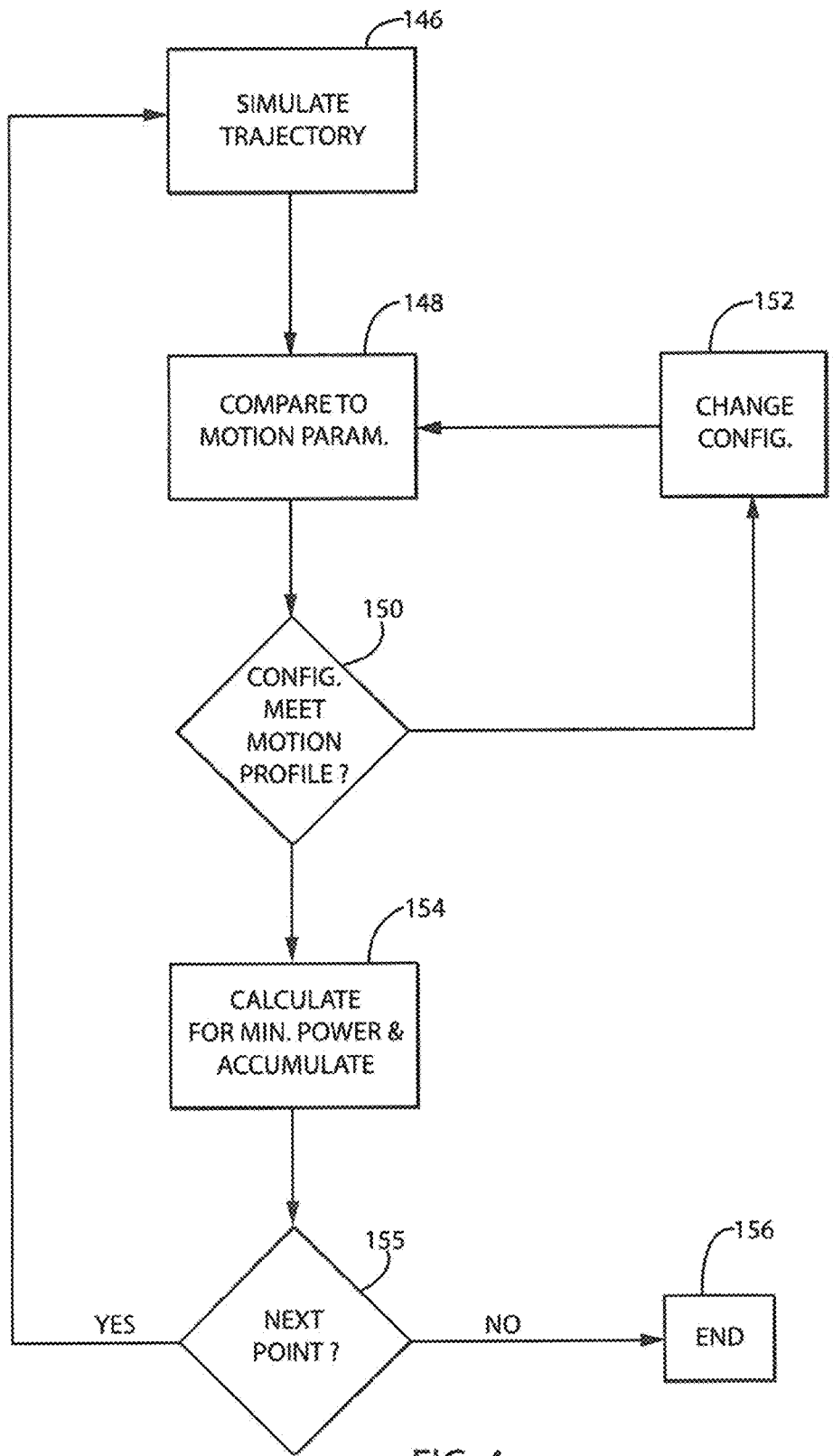
FIG. 4 is flow chart for an algorithm of the motion control configuration of FIG. 3 in accordance with an embodiment of the invention.

Referring now to FIG. 4, a flow chart illustrates an algorithm of the motion control configuration of FIG. 3 in accordance with an embodiment of the invention. At block 146, the evaluation engine simulates a trajectory of the electronic motion profile at a sampling point using simulation and modeling data for the motion control system which may be stored in database. Next, at block 148, the simulated trajectory is compared to the performance parameters characterizing the electronic motion profile. At decision block 150, a determination is made if the presently selected configuration implements the electronic motion profile while substantially meeting the performance parameters.

If the presently selected configuration does not successfully meet one or more of the performance parameters, in block 152 the configuration may be changed accordingly and the process may return to block 152. However, if the presently selected configuration does meet the performance parameters, in block 154 minimum power consumption may be calculated and accumulated for the sampling point along the trajectory. At decision block 155, a determination is made if the electronic motion profile continues to another sampling point, and if so, the process repeats at block 146. Otherwise, the process ends at block 156.

Figure 5A:
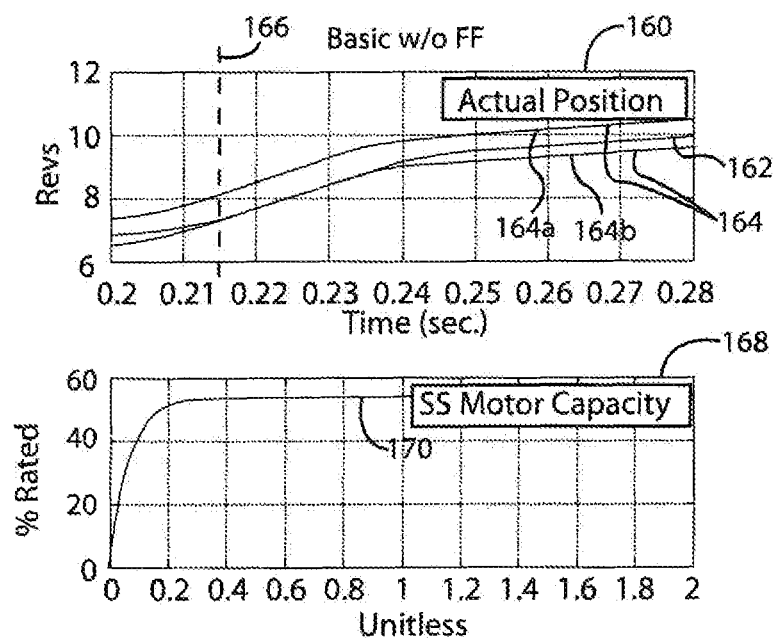
FIG. 5A is an exemplar graph of an electronic motion profile for a load operating with a performance parameter and compared to a graph illustrating corresponding electric motor thermal capacity or electric motor energy efficiency.

Referring now to FIG. 5A, an exemplar graph 160 illustrates an electronic motion profile 162 for an electric motor operating with a performance parameter representing a first error threshold or tolerance band 164. The first error threshold 164 comprises an upper limit 164a and lower limit 164b. Here, the upper limit 164a and the lower limit 164b is less than a predefined percentage of the range of the motion profile 162, such as less than 5%.

Per the motion profile 162, the electric motor variably increases in revolutions per minute ("RPM") over a period of time. At an approximate time 166, the motion profile 162 begins to cross the lower limit 164b, which causes a servo mechanical device driving the electric motor to further increase the drive strength by providing more current (and power/energy) to the electric motor. A separate graph 168 illustrates a corresponding thermal capacity for the electric motor, which may also be shown via electric motor energy efficiency A steady state level 170 of approximately 55% is reached. As used herein, capacity for an electric motor indicates a percent utilization of the motor (and related heat generated from the motor).

Figure 5B:
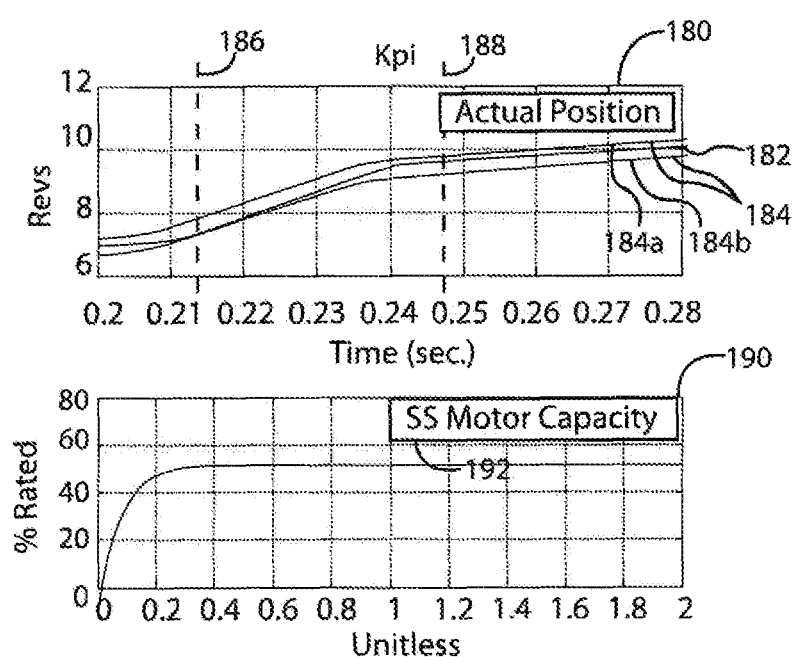
FIG. 5B is an exemplar graph of an electronic motion profile for a load operating with a tighter performance parameter and compared to a graph illustrating a corresponding electric motor thermal capacity or electric motor energy efficiency.

Referring now to FIG. 5B, an exemplar graph 180 illustrates a second electronic motion profile 182 for an electric motor operating with another performance parameter representing a second error threshold or tolerance band 184. The second error threshold 184 comprises an upper limit 184a and lower limit 184b. In addition, the second error threshold 184 is lesser (i.e., a tighter tolerance region) than the first error threshold 164 described above with respect to FIG. 5A.

Per the motion profile 182, the electric motor again variably increases in RPM over a period of time. At an approximate time 186, the motion profile 182 begins to cross the lower limit 184b, which causes a servo mechanical device driving the electric motor to further increase the drive strength by providing more current (and power/energy) to the electric motor. In addition, due to having a tighter tolerance region, at an approximate time 188, the motion profile 182 subsequently begins to cross the upper limit 184a, which causes the servo mechanical device driving the electric motor to decrease the drive strength by providing less current (and power/energy) to the electric motor. A separate graph 190 illustrates a corresponding thermal capacity for the electric motor, which may also be shown via electric motor energy efficiency. A steady state level 192 of approximately 62% is reached. This increase in motor capacity (and heat) is due to the electric motor's adherence to a tighter tolerance region which requires increased corrections.

Figure 5C:
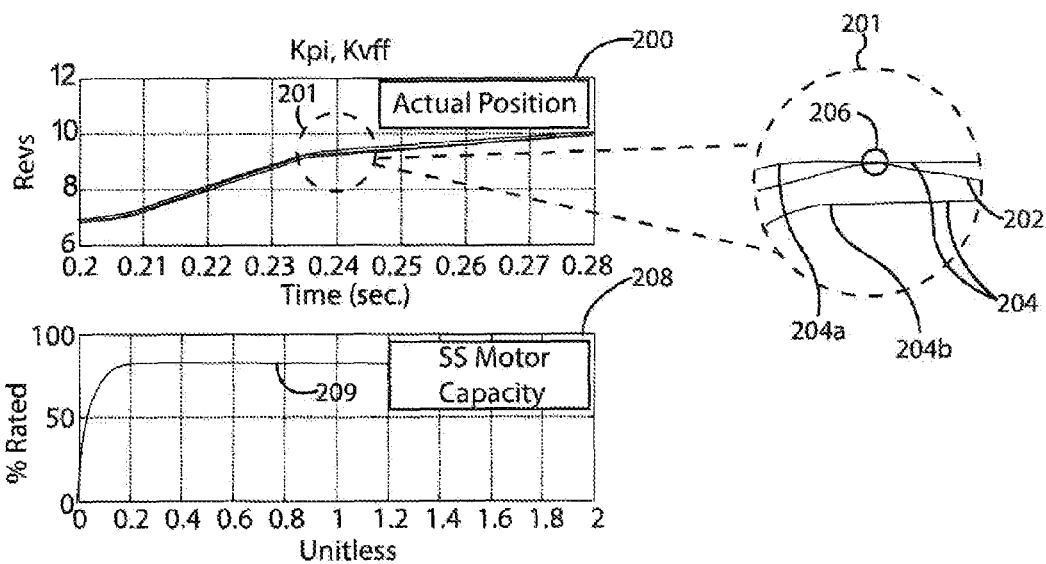
FIG. 5C is an exemplar graph of an electronic motion profile for a load operating with an even tighter performance parameter and compared to a graph illustrating a corresponding electric motor thermal capacity or electric motor energy efficiency.

Referring now to FIG. 5C, an exemplar graph 200 illustrates in a focus region 201 a third electronic motion profile 202 for an electric motor operating with another performance parameter representing a third error threshold or tolerance band 204. The third error threshold 204 comprises an upper limit 204a and lower limit 204b. In addition, the third error threshold 204 is lesser (i.e., a tighter tolerance region) than the first error threshold 164, described above with respect to FIG. 5A, and the second error threshold 184, described above with respect to FIG. 5B.

Per the motion profile 202, the electric motor again variably increases in RPM over a period of time. Due to the even tighter tolerance region, the servo mechanical device driving the electric motor must increase and decrease the drive strength to the electric motor more often than before, such as correction at an approximate time 206 in the focus area 201. A separate graph 208 illustrates a corresponding thermal capacity for the electric motor, which may also be shown via electric motor energy efficiency. A steady state level 209 of approximately 80% is reached. This further increase in motor capacity (and heat) is again due to the electric motor's adherence to an even tighter tolerance region which requires even more corrections than before.

Figure 5D:
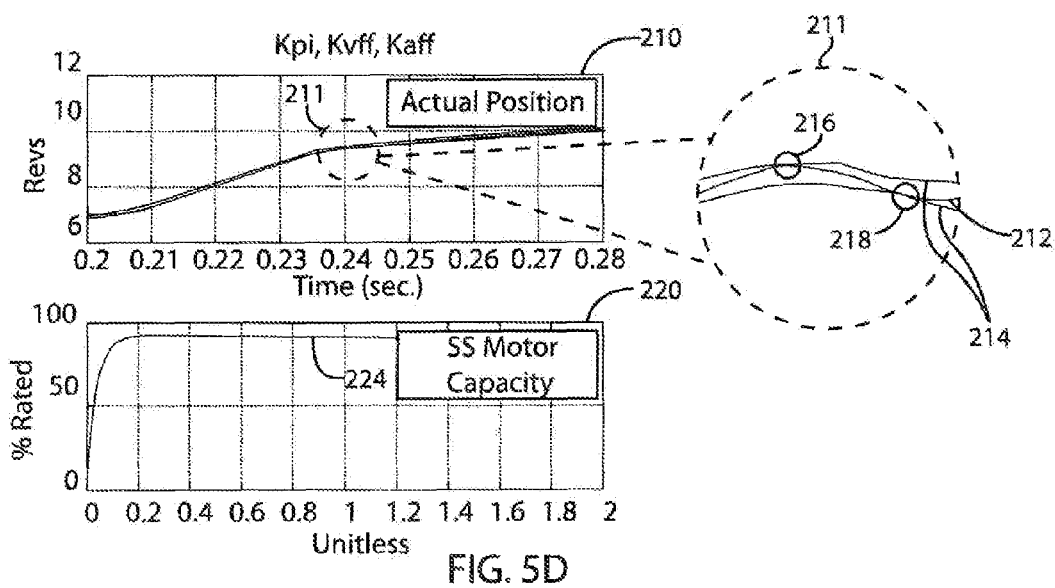
FIG. 5D is an exemplar graph of an electronic motion profile for a load operating with an even tighter error performance parameter and compared to a graph illustrating a corresponding electric motor thermal capacity or electric motor energy efficiency.

Finally, referring now to FIG. 5D, an exemplar graph 210 illustrates in a focus region 211 a fourth electronic motion profile 212 for an electric motor operating with another performance parameter representing a fourth error threshold or tolerance band 214. The fourth error threshold 214 comprises an upper limit 214a and lower limit 214b. In addition, the fourth error threshold 214 is lesser (i.e., a tighter tolerance region) than the first error threshold 164, described above with respect to FIG. 5A, the second error threshold 184, described above with respect to FIG. 5B, and the third error threshold 204, described above with respect to FIG. 5C.

Per the motion profile 212, the electric motor again variably increases in RPM over a period of time. Due to the even tighter tolerance region, the servo mechanical device driving the electric motor must increase and decrease the drive strength to the electric motor more often than before, such as corrections at approximate times 216 and 218 in the focus area 211. A separate graph 220 illustrates a corresponding thermal capacity for the electric motor, which may also be shown via electric motor energy efficiency. A steady state level 224 of approximately 90% is reached. This further increase in motor capacity (and heat) is again due to the electric motor's adherence to an even tighter tolerance region which requires even more corrections than before. This may correspond, for example, to a period requiring high precision in the industrial process.

Figure 6A:
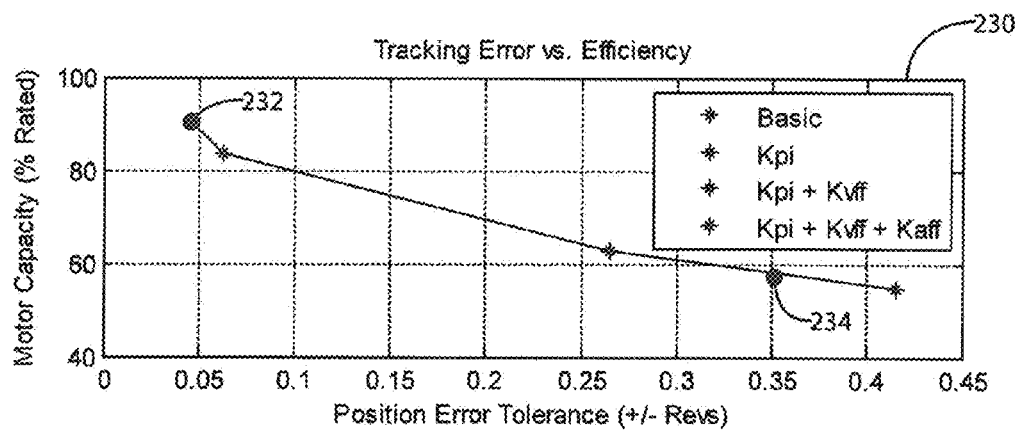
FIG. 6A is an exemplar graph illustrating a relative comparison between utilizations/thermal capacities for an electric motor and error thresholds or tolerances.

Referring now to FIG. 6A, an exemplar graph 230 illustrates a relative comparison between utilizations/thermal capacities for an electric motor and performance parameters representing error thresholds or tolerances. As error thresholds increase along the x-axis (i.e., as tolerance regions loosen), motor utilization/thermal capacity decreases. For example, at a higher point 232 on the graph 230, a lesser error threshold (i.e., tighter tolerance) of +/−0.05 RPM results in a motor utilization/thermal capacity of approximately 88%. However, at lower point 234 on the graph 230, a greater error threshold (i.e., looser tolerance) of +/−0.35 RPM results in a lower motor utilization/thermal capacity of approximately 58%.

Figure 6B:
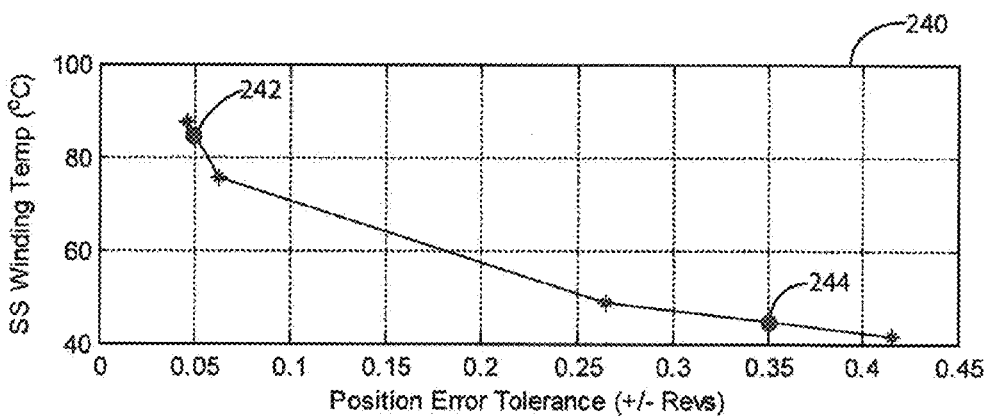
FIG. 6B is an exemplar graph illustrating a relative comparison between temperatures for the electric motor and error thresholds or tolerances as corresponding to FIG. 6A.

Referring now to FIG. 6B, an exemplar graph 240 illustrates a relative comparison between temperatures for the electric motor and performance parameters representing error thresholds or tolerances as corresponding to FIG. 6A. As error thresholds increase along the x-axis (i.e., as tolerance regions loosen), motor temperature decreases. For example, at a higher point 242 on the graph 240, the lesser error threshold (i.e., tighter tolerance) of +/−0.05 RPM results in a motor temperature of approximately 85.degree. C. However, at lower point 244 on the graph 240, a greater error threshold (i.e., looser tolerance) of +/−0.35 RPM results in a lower motor temperature of approximately 45.degree. C.

Figure 7:
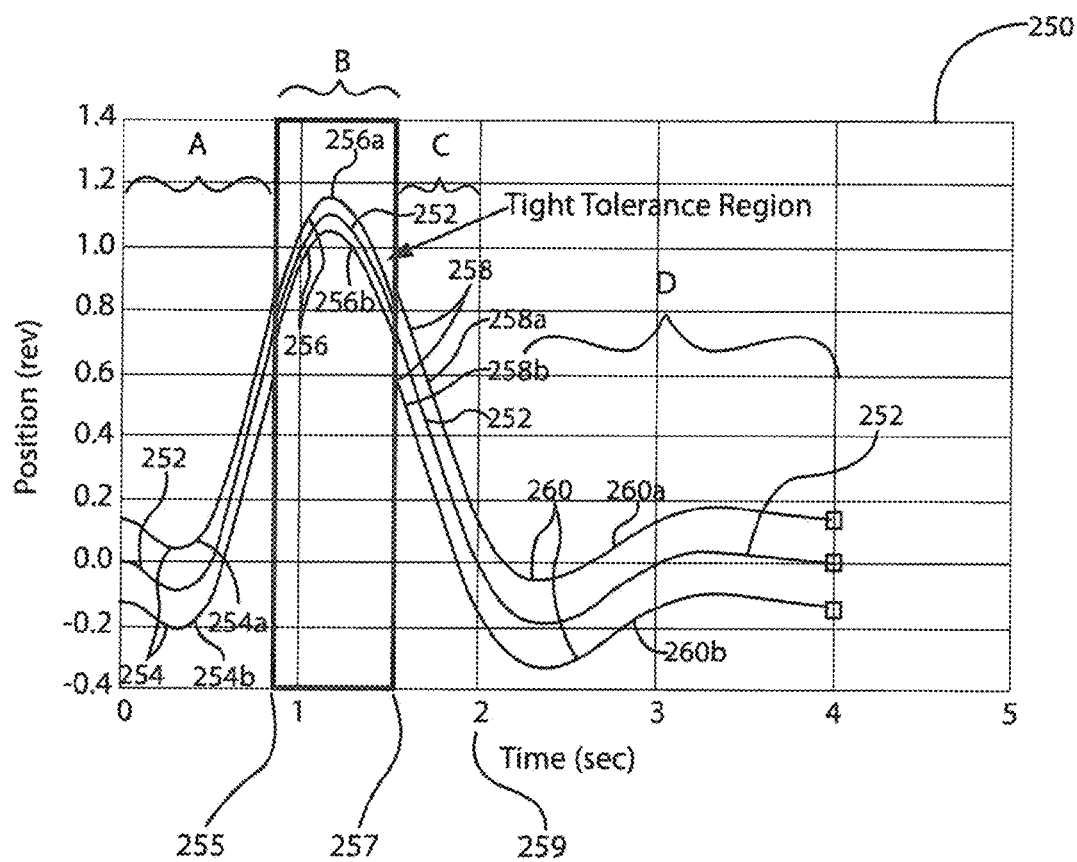
FIG. 7 is an exemplar graph illustrating multiple performance parameters that are non-overlapping with respect to time in accordance with an embodiment of the invention.

Referring now to FIG. 7, an exemplar graph 250 illustrates an electronic motion profile 252 traversing through multiple sub-periods or regions "A," "B," "C" and "D," each with differing performance parameters that are non-overlapping with respect to time in accordance with an embodiment of the invention. According to the motion profile 252, the electric motor changes position over a period of time. In the first region A, the motion profile 252 for the electric motor operates with a performance parameter representing a first error threshold or tolerance band 254. The first error threshold 254 comprises an upper limit 254a and lower limit 254b. The upper limit 254a and the lower limit 254b is less than 5% of the range of the motion profile 252. This may correspond to a sub-period requiring lesser precision in the industrial process. Accordingly, the motion planner provides the drive with a first set of tuning parameters in the first region A.

At an approximate time 255, the motion profile 252 enters the second region B. In the second region B, the motion profile 252 for the electric motor operates with a performance parameter representing a second, lesser error threshold or tolerance band 256 (i.e., a tighter tolerance region). The second error threshold 256 comprises an upper limit 256a and lower limit 256b. This may correspond to a sub-period requiring the highest precision in the industrial process. Consequently, in the second region B, the capacity for the electric motor would be at its highest. Accordingly, the motion planner provides the drive with a second set of tuning parameters in the second region B.

At an approximate time 257, the motion profile 252 enters the third region C. In the third region C, the motion profile 252 for the electric motor operates with a performance parameter representing a third error threshold or tolerance band 258 that is greater than the second error threshold 256 and equal to the first error threshold 254. The third error threshold 258 comprises an upper limit 258a and lower limit 258b. This may correspond to a sub-period requiring lesser precision in the industrial process. Accordingly, the motion planner provides the drive with a third set of tuning parameters in the third region B.

Finally, at an approximate time 259, the motion profile 252 enters the fourth region D. In the fourth region D, the motion profile 252 for the electric motor operates with a performance parameter representing a fourth error threshold or tolerance band 260 that is greater than the first error threshold 254, the second error threshold 256 and the third error threshold 258. The fourth error threshold 260 comprises an upper limit 260a and lower limit 260b. This may correspond to a sub-period requiring the least precision in the industrial process. Consequently, in the fourth region D, the capacity for the electric motor would be lowered. Accordingly, the motion planner provides the drive with a fourth set of tuning parameters in the fourth region B.

Thus, error can be dynamically defined within multiple regions or zones of the motion profile, and the motion planner can adjust tuning parameters on the fly to realize minimum energy/power usage. As a result, for the electronic motion profile 252 traversing through the multiple regions A, B, C and D, minimum energy/power usage is achieved.

Figure 8:
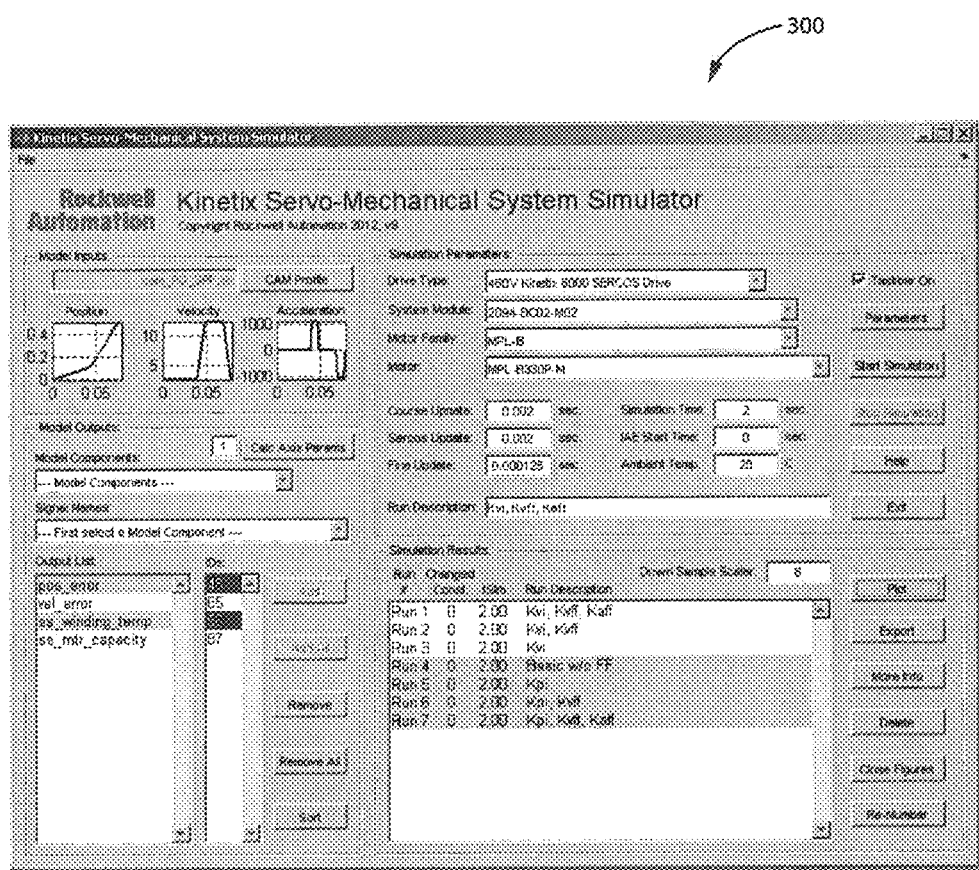
FIGS. 8-10 are exemplar graphical user interfaces displaying a simulation environment, fields and output in accordance with an embodiment of the invention.
Figure 9:
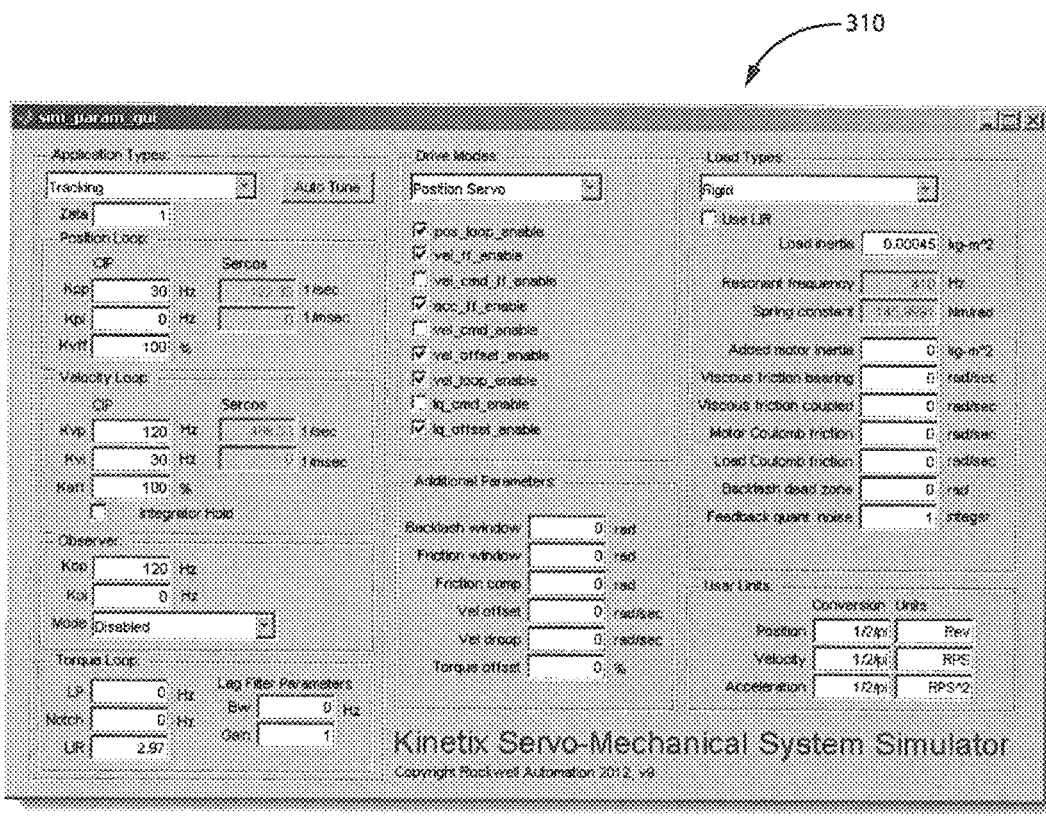
Figure 10:
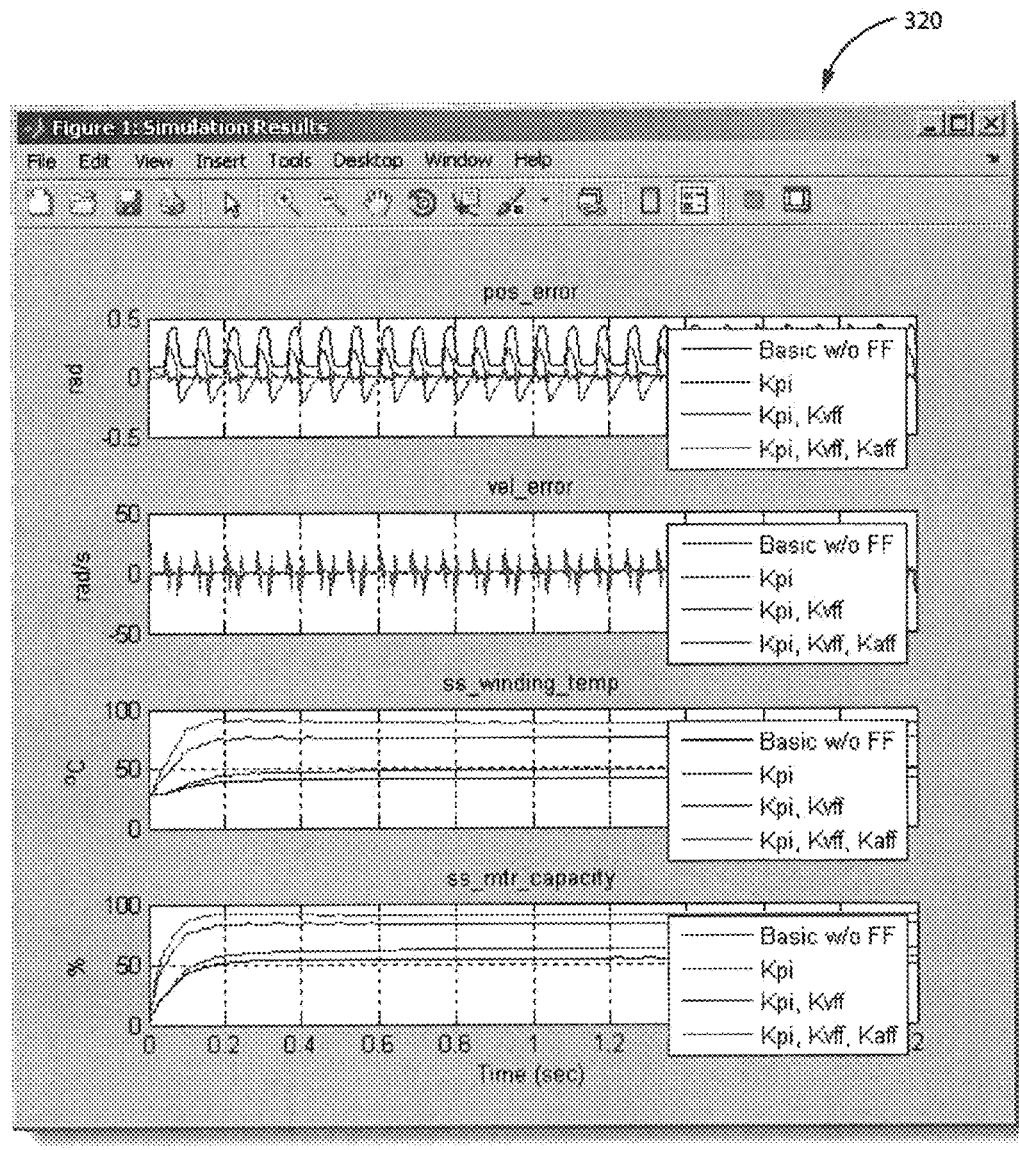

Referring now to FIGS. 8-10, exemplar graphical user interfaces display a simulation environment 300, simulation parameters and fields 310 and simulation output 320 in accordance with an embodiment of the invention. An electronic motion profile and performance parameters may be configured, and a simulation may be performed with results displayed, which may provide a motion control configuration implementing the electronic motion profile while substantially meeting the performance parameters with a minimum amount of power consumed.

Figure 11:
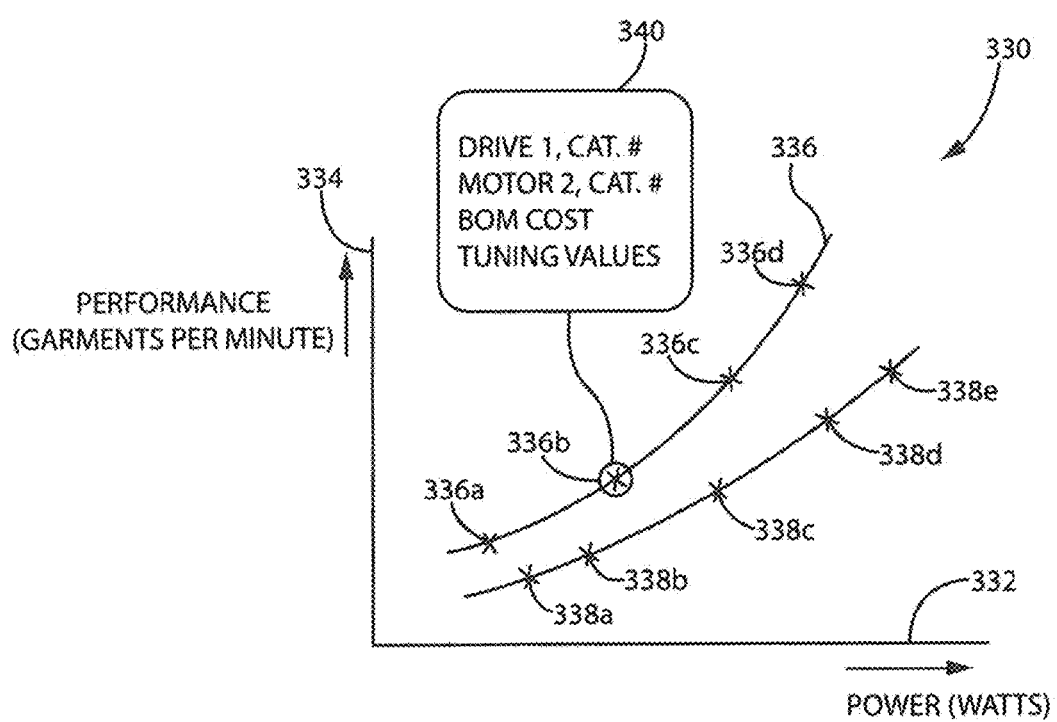
FIG. 11 is an exemplar graphical user interface displaying results comparing power consumed to performance of the motion control configuration in accordance with an embodiment of the invention.

Referring now to FIG. 11, is an exemplar graphical user interface displays results 330 comparing energy efficiency 332, which may be measured, at least in part, in Watts, or Kilowatt-Hours, to performance 334 of the motion control configuration, measured in garments per minute, in accordance with an embodiment of the invention. A first curve 336 displays four possible configurations, 336a-d, and a second curve 338 displays another five possible configurations, 338a-e. Each possible configuration allows a quick comparison between power consumed and performance for that configuration to customize maximum performance with minimum power consumption.

A user may select a configuration, such as selected configuration 336b by highlighting with a mouse, and a resulting popup window may display details 340 for that configuration. Details 340 displayed may include a product or catalog number for a drive, a product or catalog number for an electric motor, a BOM and cost, an estimated total cost of ownership ("TCO") and/or tuning parameters, gain values and/or other settings for the configuration. A user may determine and compare the effects of changes in the electronic motion profile, one or more performance parameters and/or the tuning parameters to optimize configurations with respect to power and performance.

Alternative embodiments may implement various features described above in hardware and/or software and with varying levels of integration. In addition, alternative embodiments may combine or further separate or distribute hardware elements, or software elements, as may be appropriate for the task. For example, a combined motion planner and electronic computer, or a combined motion planner, electronic computer, drive and motor, may be used as understood in the art. Such alternative embodiments are within the scope of the invention.

Certain terminology is used herein for purposes of reference only, and thus is not intended to be limiting. For example, terms such as "upper," "lower," "above" and "below" refer to directions in the drawings to which reference is made. Terms such as "front," "back," "rear," "bottom" and "side" describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second" and other such numerical terms referring to structures do not imply a sequence or order unless clearly indicated by the context.

When introducing elements or features of the present disclosure and the exemplary embodiments, the articles "a," "an," "the" and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor," can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

What is claimed is:

1. A motion control configuration program stored in a non-transitory computer-readable storage medium and executable on an electronic computer comprising:
   a first data element storing an electronic motion profile characterizing a physical motion for a load over a period of time;
   a second data element storing a performance parameter characterizing an acceptable level of error with respect to the electronic motion profile; and
   an evaluation engine determining a motion control configuration comprising a drive adapted to power a motor carrying out the physical motion of the load and a plurality of tuning parameters for the drive;
   wherein the motion control configuration is determined based on implementing the electronic motion profile stored in the first data element while substantially meeting the performance parameter stored in the second data element with a minimum amount of power consumed, and
   wherein determining the motion control configuration comprises simulating a trajectory of the electronic motion profile using a model stored in database and accumulating power consumption along the trajectory.

2. The motion control program of claim 1, further comprising a third data element storing another performance, parameter characterizing an acceptable level of error with respect to the motion profile, wherein the motion control configuration is determined based on implementing the electronic motion profile stored in the first data element while substantially meeting the performance parameters stored in the second and third data elements with a minimum amount of power consumed.

3. The motion control program of claim 2, wherein the performance parameters are non-overlapping with respect to time.

4. The motion control program of claim 1, further comprising selecting a drive from among a plurality of drives having differing capabilities stored in a database.

5. The motion control program of claim 4, wherein the drive includes a proportional-integral-derivative controller.

6. The motion control program of claim 5, wherein the plurality of tuning parameters is a plurality of gain values for the proportional-integral-derivative controller.

7. The motion control program of claim 1, further comprising displaying to a graphical user interface results comparing energy efficiency to performance of the motion control configuration.

8. The motion control program of claim 7, wherein the displaying allows selecting differing motion control configurations showing differing results.

9. The motion control program of claim 1, further comprising changing at least one of the electronic motion profile, the performance parameter and the plurality of tuning parameters to determine a motion control configuration optimized with respect to power consumed versus performance of the motion control configuration.

10. The motion control program of claim 1 wherein the performance parameter indicates a maximum position error.

11. The motion control program of claim 1, wherein the performance parameter indicates a maximum velocity error.

12. A method for analyzing power consumption in a motion control system comprising:
   (a) receiving an electronic motion profile characterizing a physical motion for a load over a period of time;
   (b) receiving a performance parameter characterizing an acceptable level of error with respect to the motion profile; and
   (c) determining a motion control configuration comprising a drive adapted to power a motor carrying out the physical motion of the load and a plurality of tuning parameters for the drive, wherein the motion control configuration is determined based on implementing the electronic motion profile while substantially meeting the performance parameter with a minimum amount of power consumed,
   wherein determining the motion control configuration comprises simulating a trajectory of the electronic motion profile using a model stored in database and accumulating power consumption along the trajectory.

13. The method of claim 12, further comprising receiving another performance parameter characterizing an acceptable level of error with respect to the motion profile, wherein the motion control configuration is determined based on implementing the electronic motion profile while substantially meeting each of the performance parameters with a minimum amount of power consumed.

14. The method of claim 13, wherein each of the performance parameters are non-overlapping with respect to time.

15. The method of claim 12, further comprising selecting a drive from among a plurality of drives having differing capabilities stored in a database.

16. The method of claim 12, further comprising displaying to a graphical user interface results comparing power consumedenergy efficiency to performance of the motion control configuration.

17. The method of claim 16, wherein the displaying allows selecting differing motion control configurations showing differing results.

18. The method of claim 12, further comprising changing at least one of the electronic motion profile, the performance parameter and the plurality of tuning parameters to determine a motion control configuration optimized with respect to power consumed versus performance of the motion control configuration.

* * * * *